(12) United States Patent
Miyazawa

(10) Patent No.: US 7,520,714 B2
(45) Date of Patent: Apr. 21, 2009

(54) HANDLING APPARATUS

(75) Inventor: Kazuki Miyazawa, Tokyo (JP)

(73) Assignee: Koganei Corporation, Tokyo (JP)

( * ) Notice: Subject to any disclaimer, the term of this patent is extended or adjusted under 35 U.S.C. 154(b) by 398 days.

(21) Appl. No.: 10/584,441

(22) PCT Filed: Dec. 25, 2003

(86) PCT No.: PCT/JP03/16800

§ 371 (c)(1),
(2), (4) Date: Jun. 21, 2006

(87) PCT Pub. No.: WO2005/063456

PCT Pub. Date: Jul. 14, 2005

(65) Prior Publication Data

US 2007/0163377 A1    Jul. 19, 2007

(51) Int. Cl.
*B25J 9/00*    (2006.01)
(52) U.S. Cl. .................. 414/735; 294/64.1; 414/790.5; 901/21; 29/739
(58) Field of Classification Search ............. 29/729, 29/739, 740–742, 564.1–564.4, 832–834; 294/64.1; 414/735, 737, 138.1, 790.1; 901/47; 198/378, 341.05, 471.1, 568; 269/21, 153, 269/157, 25
See application file for complete search history.

(56) References Cited

U.S. PATENT DOCUMENTS 5,619,782 A * 4/1997 Tanaka et al. ............. 29/407.1

2007/0163377 A1 * 7/2007 Miyazawa ................ 74/490.03

FOREIGN PATENT DOCUMENTS

| JP | 04-331088 | 11/1992 |
|---|---|---|
| JP | 07-096487 | 4/1995 |
| JP | 11-042586 | 2/1999 |
| JP | 11-300545 | 11/1999 |
| JP | 2000094377 | 4/2000 |
| JP | 2000288871 | 10/2000 |
| JP | 2001334485 | 12/2001 |
| JP | 2003285290 | 10/2003 |
| JP | 2004082317 | 3/2004 |

* cited by examiner

*Primary Examiner*—Minh Trinh
(74) *Attorney, Agent, or Firm*—McCormick, Paulding & Huber LLP

(57) ABSTRACT

A handling apparatus mounted on a moving member for holding, conveying, and installing a workpiece has a floating plate attached for radial movement to an apparatus body 10 connecting with the movable member, and a workpiece holding device for holding the workpiece on the floating plate. A lock plate is provided for fastening the floating plate to the apparatus body in a radial direction, A fastening piston is coupled to the lock plate through a fastening rod, and the floating plate can be fastened at any position. An aligning piston on which a tapered surface is formed is mounted on the apparatus body for reciprocation. The tapered surface of the aligning piston engages an aligning hole of the floating plate to return the floating plate in the radial direction to an origin position.

7 Claims, 6 Drawing Sheets

HANDLING APPARATUS

CROSS-REFERENCE TO RELATED APPLICATIONS

This application is entitled to the benefit of and incorporates by reference essential subject matter disclosed in International Patent Application No. PCT/IP2003/016800 filed on Dec. 25, 2003.

TECHNICAL FIELD

The present invention relates to a handling apparatus holding and conveying a workpiece, and mounting the workpiece on an installing position.

BACKGROUND ART

Regarding an electronic part such as a semiconductor chip as a workpiece, in order to convey the workpiece from a workpiece accommodated position to a workpiece installing position and install the workpiece at the workpiece installing position, a handling apparatus reciprocating between the workpiece accommodated position and the workpiece installing position is used. To the handling apparatus, a vacuum sucking device for vacuum-sucking the workpiece and chucks or hands driven for opening/closing by a pneumatic cylinder or electric motor are attached as a workpiece holding device. The workpiece is conveyed to a predetermined position by the handling apparatus in a state in which the workpiece is held by the workpiece holding device.

In the handling apparatus mentioned above, there is the case where a stop position of the handing apparatus is deviated to the workpiece installing position when the workpiece is positioned at the workpiece installing position. A displacement direction includes the case where the workpiece is deviated in a lateral direction with respect to a center line of the workpiece installing position or deviated in a rotational direction around a center axis. In order to make it possible to install the workpiece at the predetermined position even if the stop position of the handing apparatus is deviated, an aligning mechanism called a compliance mechanism is incorporated in the handling apparatus.

As the aligning mechanism mentioned above, there is the case where a function of making the workpiece holding device movable by an external force in two axial directions of X and Y axes with respect to an origin position serving as a reference and a function of making it shiftable in a rotational direction are often required, and there is further the case where it is necessary to automatically return the workpiece holding device to the origin position. In addition, the aligning mechanism includes the case of adjusting the position of the workpiece holding device each time the workpiece is installed, and the case of adjusting the position of the workpiece holding device and locking the workpiece holding device at the adjusted position to convey and position the predetermined number of workpieces. In any case, in order to operate a compact electronic part, it is necessary to downsize the handling apparatus and align the workpiece holding device by the compact apparatus.

An object of the present invention is to make a workpiece holding device movable in two axial directions of X and Y axes and in a rotational direction by an external force and make it automatically return to an origin position.

Another object of the present invention is to achieve a downsizing of a handling apparatus having an aligning function.

DISCLOSURE OF THE INVENTION

A handling apparatus according to the present invention is an apparatus mounted on a moving member and conveying a workpiece to an installing position for installation, the handling apparatus comprising: an apparatus body attached to the moving member; a floating plate attached so as to be movable in a diametrical direction with respect to a center axis of the apparatus body, the floating plate to be mounted on a workpiece holding device for holding the workpiece; a fastening rod provided in the apparatus body so as to be reciprocable in an axial direction, a lock plate for fastening the floating plate is attached to the fastening rod; and a plurality of aligning pistons having taper surfaces engaged respectively with a plurality of aligning holes formed in the floating plate, the aligning pistons being mounted on the apparatus body so as to be reciprocable in the axial direction, wherein the floating plate is fastened to the apparatus body by the lock plate, and the floating plate is returned to a reference position of the apparatus body by the aligning pistons.

The handling apparatus according to the present invention is such that a fastening piston is provided in the fastening rod, and a fastening force to the floating plate is applied by fluid. Also, the handling apparatus according to the present invention is such that a pressing force in a direction of moving the taper surfaces toward the floating plate is generated by the fluid applied to the aligning pistons.

The handling apparatus according to the present invention further comprises a regulating pin attached to the apparatus body so as to protrude into a guide hole formed in the floating plate and regulating a moving amount of the floating plate.

The handling apparatus according to the present invention is such that a steel ball is interposed in a slide surface of the floating plate and that an air layer is formed in a slide surface of the floating plate. Also, the handling apparatus according to the present invention is such that a lubricating oil layer is formed in a slide surface of the floating plate.

According to the present invention, since the floating plate to which the workpiece holding device is attached is fastened by the lock plate and the taper surface of the aligning piston is engaged with a plurality of aligning holes formed in the floating plate to return the floating plate to the reference position, that is, the origin position, it is possible to displace the floating plate to an optional position in two axial directions of X and Y axes and in the rotational direction and to automatically return it to the origin position by air pressure.

Also, since the fastening force to the lock plate is applied by the air pressure, it is possible to actuate the aligning piston and the fastening piston in a limited space by common air pressure. Further, it is possible to regulate a moving range of the lock plate by a regulating pin and to prevent the floating plate from moving excessively, whereby the returning motion can be securely achieved. As mentioned above, it is possible to actuate the aligning piston and the fastening piston in the limited space by the common air pressure.

Further, it is possible to smoothly move the floating plate by interposing the steel ball in the sliding surface of the floating plate, forming the air layer, or forming the lubricating oil layer. It is possible to regulate the moving range of the lock plate by the regulating pin and to securely achieve the returning motion of the lock plate.

BEST MODE FOR CARRYING OUT THE INVENTION

Hereinafter, an embodiment of the present invention will be described in detail with reference to the accompanying drawings.

Figure 1:
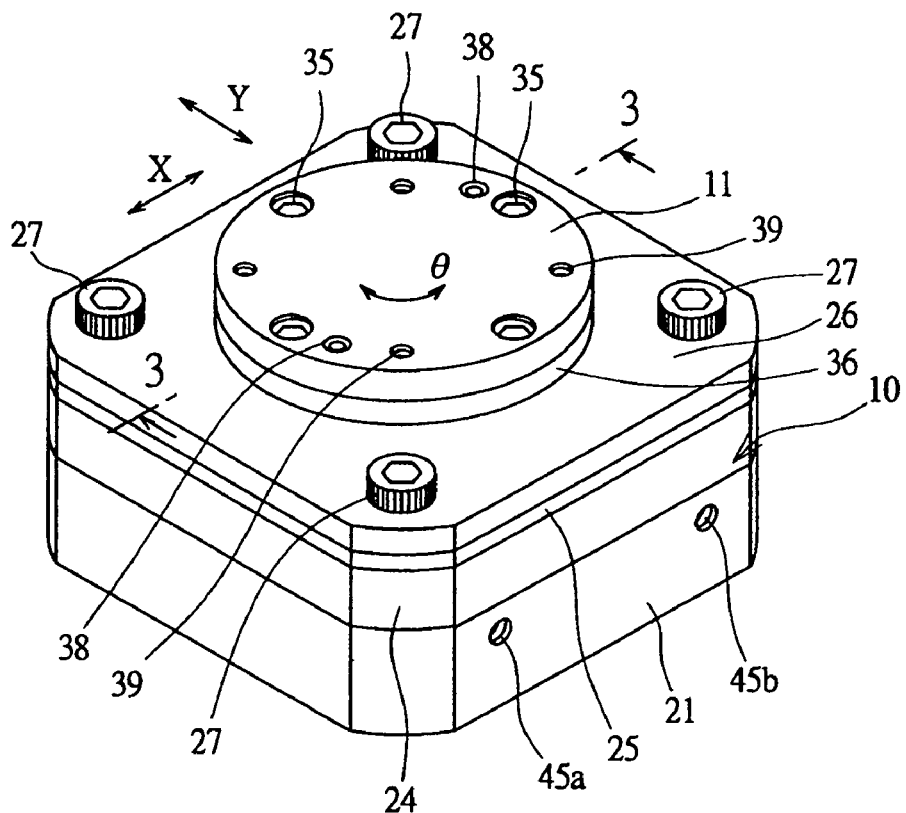
FIG. 1 is a perspective view showing an outer appearance of a handling apparatus according to an embodiment of the present invention.
Figure 2:
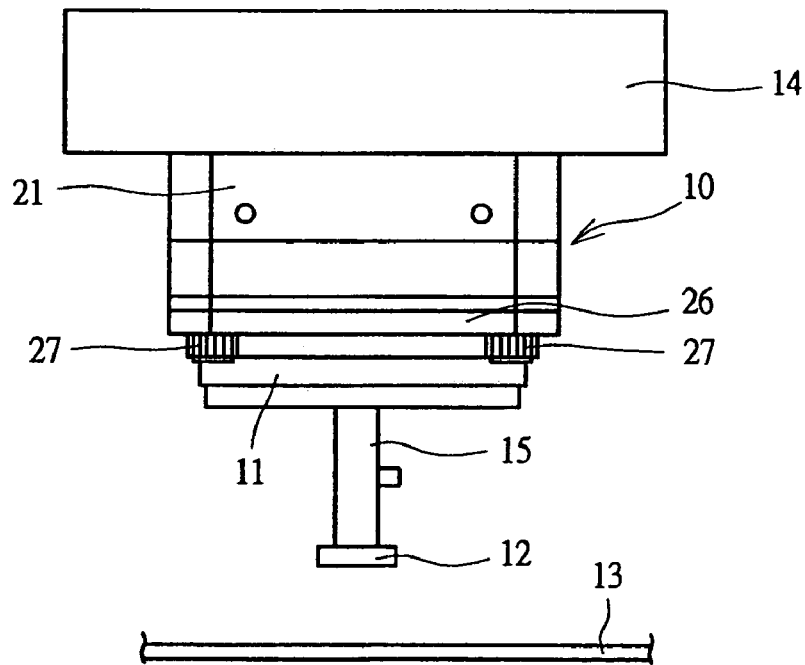
FIG. 2 is a front view showing a state in which a workpiece is positioned by using the handling apparatus shown in FIG. 1.

As shown in FIG. 1, a handling apparatus has an apparatus body 10 totally formed in an approximately rectangular parallelepiped shape. A tip plate 11 is mounted on the apparatus body 10 in such a manner as to move in two axial directions of X and Y axes along a tip surface of the apparatus body 10 and move in a rotational direction of an angle of θ. As shown in FIG. 2, when an electronic part serving as a workpiece 12 is conveyed to a predetermined installing position of a printed circuit board 13 from a workpiece accommodated position by using the handling apparatus and the workpiece 12 is installed at the installing position, the apparatus body 10 is attached to a moving member 14 such as a conveying apparatus in such a manner that the tip plate 11 is directed downward, whereby a workpiece holding device 15 constituted by a vacuum sucking device or the like is attached to the tip plate 11 directed downward. Although FIG. 2 shows the case where the handling apparatus is used in such a manner that the tip plate 11 is directed downward, the apparatus body 10 can be attached to the moving member 14 in such a manner that the tip plate 11 is directed in an optional direction in accordance with a kind of workpiece and/or a member to which the workpiece is installed.

Figure 3:
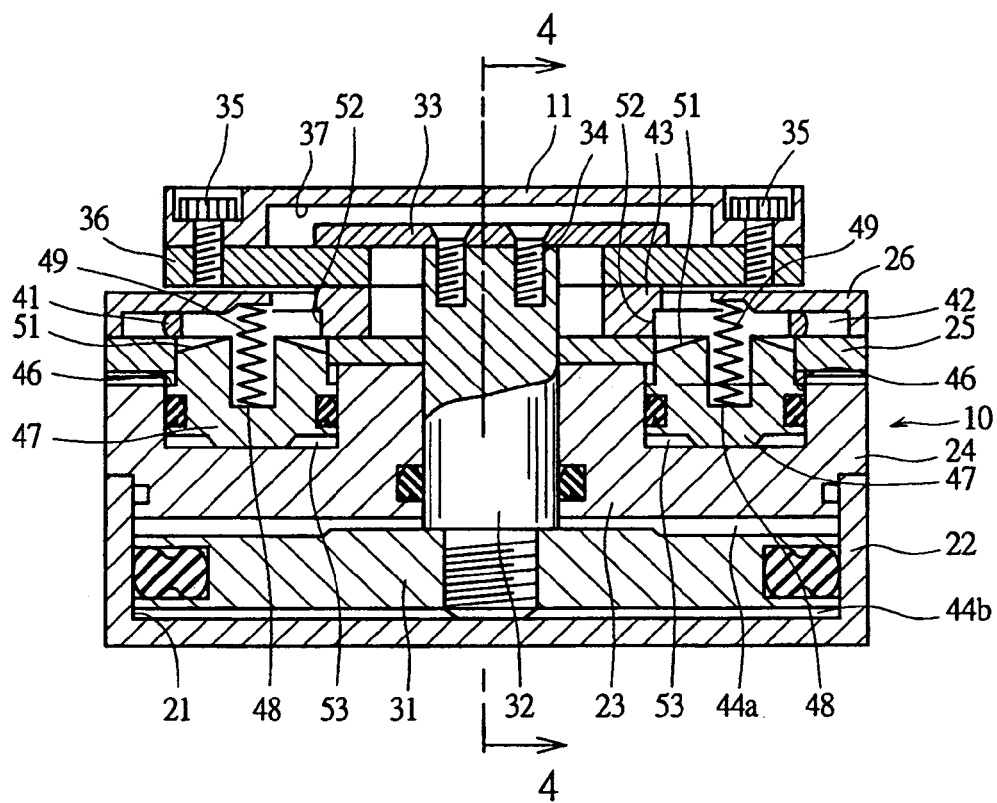
FIG. 3 is an enlarged cross-sectional view taken along line 3-3 in FIG. 1.
Figure 4:
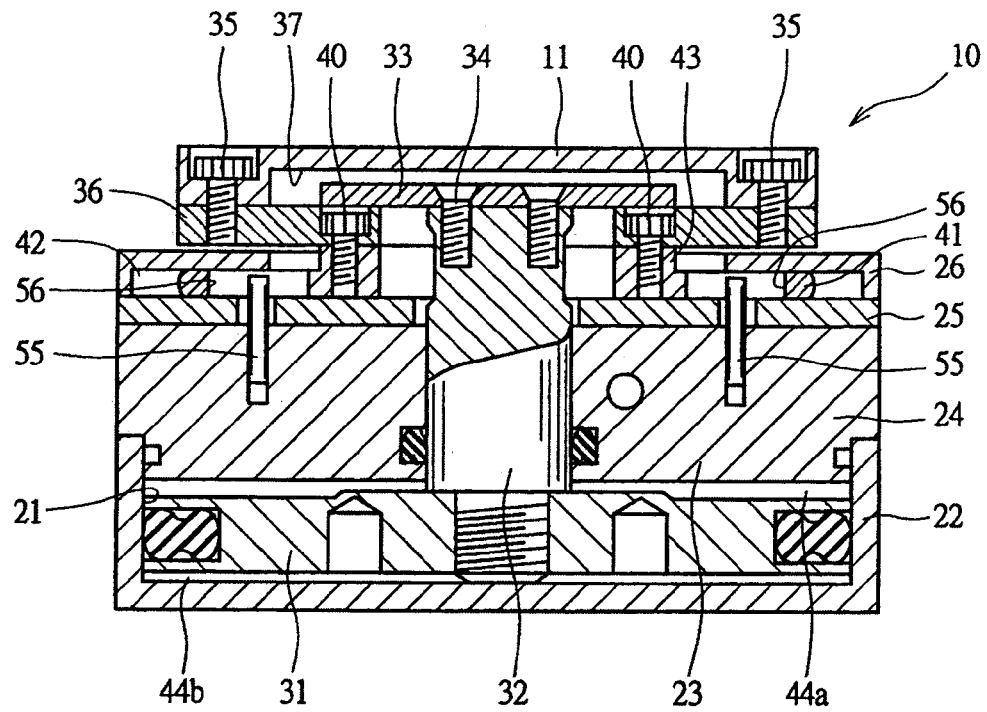
FIG. 4 is a cross-sectional view taken along line 4-4 in FIG. 3.

The apparatus body 10 has a cylinder case 22 in which a bottomed cylinder hole 21 is formed in a circular, as shown in FIGS. 3 and 4, and a cylinder block 24 in which a projection portion 23 fitted to the cylinder hole 21 is formed is attached to the cylinder case 22. A positioning plate 25 and a cover 26 are attached to the cylinder block 24. The cylinder case 22, the cylinder block 24, the positioning plate 25 and the cover 26 are fastened by four screw members 27 as shown in FIG. 1 to constitute the apparatus body 10.

Figure 5:
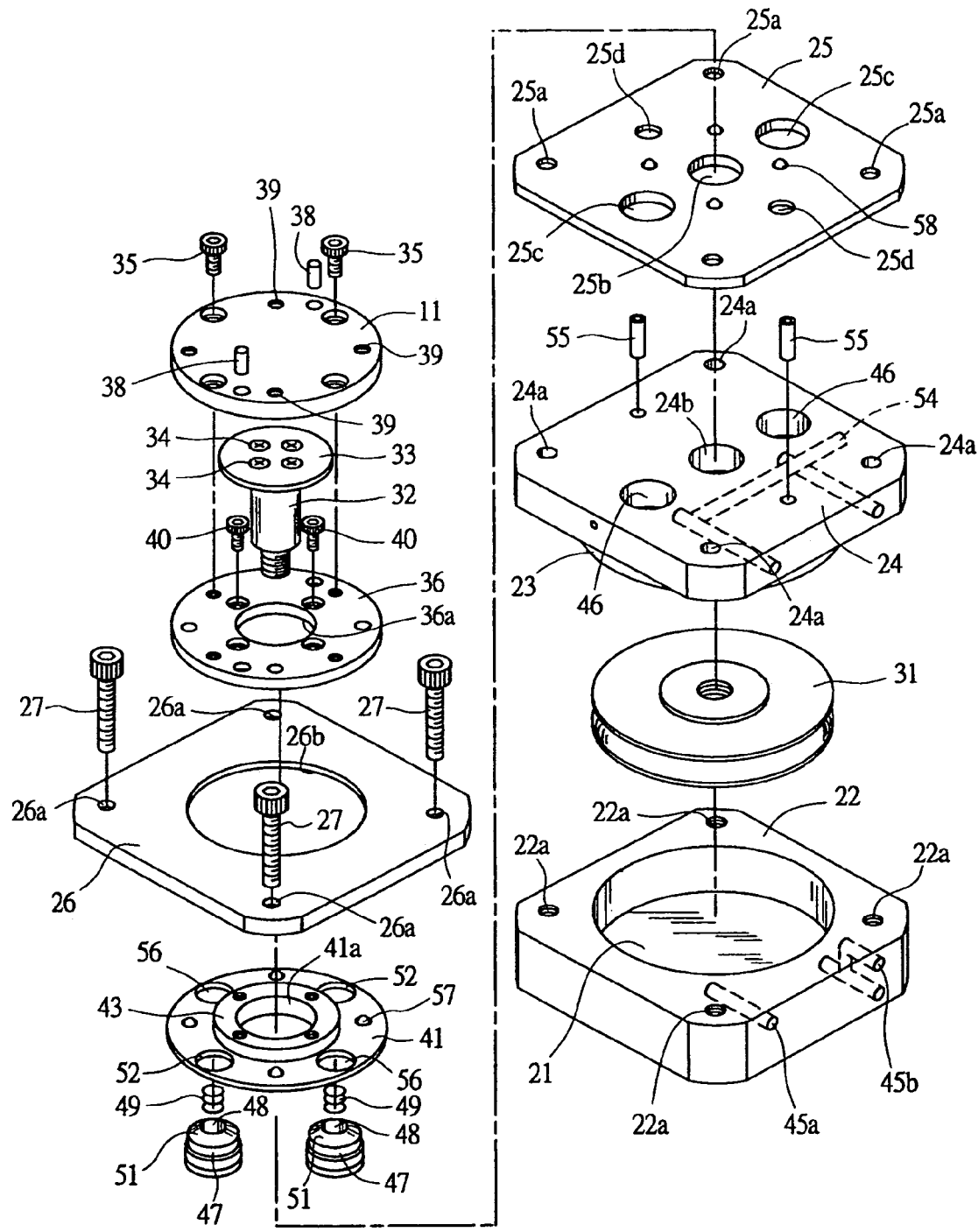
FIG. 5 is an exploded perspective view of the handling apparatus shown in FIG. 1.

FIG. 5 is an exploded perspective view of the handling apparatus shown in FIG. 1. A screw aperture 22a to which each of the screw members 27 is fastened is formed in the cylinder case 22, and four through holes 26a, 25a and 24a through which the screw members 27 pass are respectively formed in the cover 26, the positioning plate 25 and the cylinder block 24 in accordance with the number of the screw members 27.

A fastening piston 31 is incorporated in a cylinder chamber formed by the cylinder hole 21 of the cylinder case 22 and the projection portion 23 fitted thereto, and a fastening rod 32 attached to the fastening piston 31 passes through a through hole 24b formed in a center portion of the cylinder block 24 and a through hole 25b formed in the positioning plate 25, and a tip portion of the fastening rod protrudes from a tip surface of the apparatus body 10. A lock plate 33 is attached to a tip surface of the fastening rod 32 by a screw member 34.

The lock plate 33 is sandwiched between the tip plate 11 and a coupling plate 36 fixed to an inner surface of the tip plate 11 by a screw member 35, and a concave portion 37 accommodating the lock plate 33 is formed in the tip plate 11. The coupling plate 36 is coupled by the screw member 35 and is coupled to the tip plate 11 by two fastening pins 38, as shown in FIGS. 1 and 5, and a screw aperture 39 for attaching the workpiece holding device 15 is formed in the tip plate 11.

A floating plate 41 is incorporated between the cover 26 and the positioning plate 25, and a concave portion 42 accommodating the floating plate 41 is formed in the cover 26. An annular projection portion 43 is integrally provided to the floating plate 41, and the coupling plate 36 is fixed to the projection portion 43 by screw members 40, as shown in FIGS. 4 and 5. Accordingly, the workpiece holding device 15 shown in FIG. 2 is attached to the floating plate 41 via the tip plate 11 and the coupling plate 36.

Center holes 36a and 41a with diameters larger than an outside diameter of the fastening rod 32 are formed in center portions of the coupling plate 36 and the floating plate 41 as shown in FIG. 5, and a center hole 26b with a diameter larger than an outside diameter of the projection portion 43 is formed in a center portion of the cover 26. Accordingly, the tip plate 11 and the coupling plate 36 can move in two axial directions of X and Y axes between a position where the projection portion 43 is brought into contact with an outer peripheral surface of the fastening rod 32 and a position where the projection portion 43 is brought into contact with the center hole 26b of the cover 26.

As shown in FIGS. 3 and 4, the cylinder chamber formed by the cylinder case 22 and the cylinder block 24 is divided, by the fastening piston 31, into an air pressure chamber 44a for fastening and an air pressure chamber 44b for releasing the fastening. As shown in FIG. 5, the cylinder case 22 is provided with a supply/discharge port 45a communicating with the air pressure chamber 44a for fastening and a supply/discharge port 45b communicating with the air pressure chamber 44b for releasing the fastening. Accordingly, when compressed air is supplied to the air pressure chamber 44a for fastening, as shown in FIG. 3, the lock plate 33 presses the coupling plate 36 and the floating plate 41 is fastened, that is, locked. On the other hand, when the compressed air is supplied to the air pressure chamber 44b for releasing the fastening, the lock plate 33 moves away from the coupling plate 36 and the floating plate 41 can move along the tip surface of the apparatus body 10 together with the tip plate 11.

The illustrated fastening piston 31 is actuated so as to move to a fastening position and a fastening releasing position in accordance with the compressed air supplied to the air pressure chambers 44a and 44b formed on both sides of the fastening piston 31. However, the fastening piston may be structured as a single acting type in which one of a fastening force and a fastening releasing force is generated by the compressed air and the other is generated by a spring force.

As shown in FIGS. 3 and 5, two bottomed piston-accommodating holes 46 are formed in the cylinder block 24, a through hole 25c is formed in the positioning plate 25 so as to correspond to the piston-accommodating holes 46, and an aligning piston 47 is accommodated in each of the piston-accommodating holes 46 so as to be movable in an axial direction. A compression coil spring 49 is mounted in a spring accommodating hole 48 formed in each of the aligning pistons 47, and a spring force in a backward moving direction is applied to each of the aligning pistons 47 by the compression spring 49. A taper surface 51 is formed in a tip portion of each of the aligning pistons 47, and the taper surface 51 is structured so as to be engaged with an edge portion of an aligning hole 52 formed in the floating plate 41.

As shown in FIG. 3, an air pressure chamber 53 is formed by the aligning piston 47 and the piston-accommodating hole 46. In order to move the aligning piston 47 forward in such a manner that the taper surface 51 is engaged with the edge portion of the aligning hole 52 against the spring force, a supply/discharge port 54 is formed in the cylinder block 24 so as to communicate with each of the air pressure chambers 53, as shown by a dotted line in FIG. 5. Accordingly, when the compressed air is supplied to each of the air pressure chambers 53 under a state in which the compressed air is supplied to the air pressure chamber 44b for releasing the fastening and the fastening force to the coupling plate 36 by the lock plate 33 is released, the taper surfaces 51 of two aligning pistons 47 are engaged with the edge portion of the aligning holes 52 and a center of the floating plate 41 is positioned to a center of the apparatus body 10. Note that such a structure may be adopted that a taper surface or a chamfer surface is formed in the edge portion of the aligning hole 52 in accordance with the taper surface 51.

As shown in FIG. 4, two regulating pins 55 are fixed to the cylinder block 24, and each of the regulating pins 55 passes through a through hole 25d formed in the positioning plate 25 and is inserted into a guide hole 56 formed in the floating plate 41. Accordingly, since the regulating pin 55 is brought into contact with an inner peripheral surface of the guide hole 56, a moving amount of the floating plate 41 moved along the tip surface of the apparatus body 10 is regulated, so that the floating plate 41 moves in such a range that an edge portion of the aligning hole 52 can face to the taper surface 51.

Figure 6:
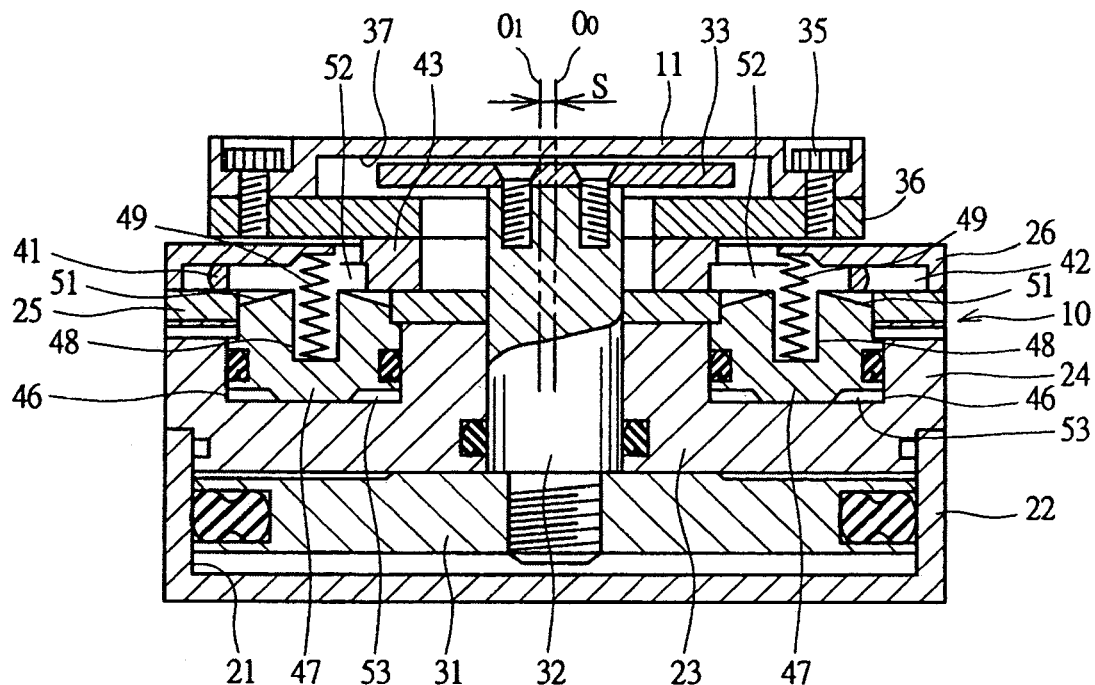
FIG. 6 is a cross-sectional view showing a state in which a floating plate is shifted.

FIG. 6 shows a state in which: the compressed air is supplied to the air pressure chamber 44b for releasing the fastening from the supply/discharge port 45b; the lock plate 33 moves apart from the coupling plate 36 to release the fastening force applied to the floating plate 41; the tip plate 11 shifts for displacement with respect to the apparatus body 10 together with the coupling plate 36; and a center axis $O_1$ of the tip plate 11 is deviated by a distance S with respect to a center axis $O_0$ of the fastening rod 32, that is, a reference axis. Thus, if the fastening force applied to the floating plate 41 is released, the tip plate 11 can freely move in two axial directions of X and Y axes and in the rotational direction along the tip surface of the apparatus body 10 until the regulating pin 55 is brought into contact with the inner peripheral surface of the guide hole 56.

A steel ball 57 is accommodated in each of a plurality of concave portions formed in the floating plate 41, as shown in FIG. 5, in such a manner that the floating plate 41 can smoothly move in two axial directions of X and Y axes and in the rotational direction under a state in which the fastening force applied to the floating plate 41 is released. Therefore, each of the steel balls 57 can be brought into contact with the cover 26. Further, steel balls 58 are accommodated in a plurality of concave portions formed in the positioning plate 25, and each of the steel balls 58 can be brought into contact with the floating plate 41. Accordingly, since both surfaces of the floating plate 41 are brought into contact with the cover 26 and the positioning plate 25 via the steel balls 57 and 58, the floating plate 41 can slowly move. In this case, the steel ball may be arranged only in one surface side of both surfaces of the floating plate 41. Further, in the case where both surfaces of the floating plate 41 are brought into contact with the cover 26 and the positioning plate 25 via the steel balls 57 and 58, such a structure may be adopted that the steel ball 57 is accommodated in the cover 26 and the steel ball 58 is accommodated in the positioning plate 25.

Such a structure may be adopted that a coating process such as a tetrafluoroethylene resin for reducing friction resistance is applied to both surfaces of the floating plate 41, without interposing the steel balls 57 and 58 in both surfaces of the floating plate 41 as mentioned above or in addition to the interposition of the steel balls 57 and 58. In this case, the coating process may be applied to a surface facing to the floating plate 41 in the cover 26 and the cylinder block 24.

In the case of conveying the workpiece 12 to a predetermined position by the workpiece holding device 15, as shown in FIG. 2, by using the handling apparatus mentioned above, the tip plate 11 may be shifted with respect to the apparatus body 10 in adjusting the stop position of the moving member 14 and the stop position of the workpiece 12. When the compressed air is supplied to the air pressure chamber 44a for fastening from the supply/discharge port 45a after making the stop position of the moving member 14 coincide with the stop position of the workpiece 12, the center axis $O_1$ is set in a state of being shifted at a distance S with respect to the center axis $O_0$ and the lock plate 33 fastens the coupling plate 36 and the floating plate 41.

Thus, in the case of adjusting the position of the workpiece holding device 15 by adjusting the position of the tip plate 11 with respect to the apparatus body 10 and of continuously conveying the predetermined number of workpieces by using the handling apparatus, it is possible to convey all the workpieces to an accurate position. For example, there is the case where adjusting an attitude in the rotational direction is required in accordance with a kind of the workpiece holding device 15 of such a type as to open/close hands or fingers and grip the workpiece. In this case, it is possible to adjust the attitude of the workpiece holding device 15 in the rotational direction by rotating the tip plate 11.

Figure 7:
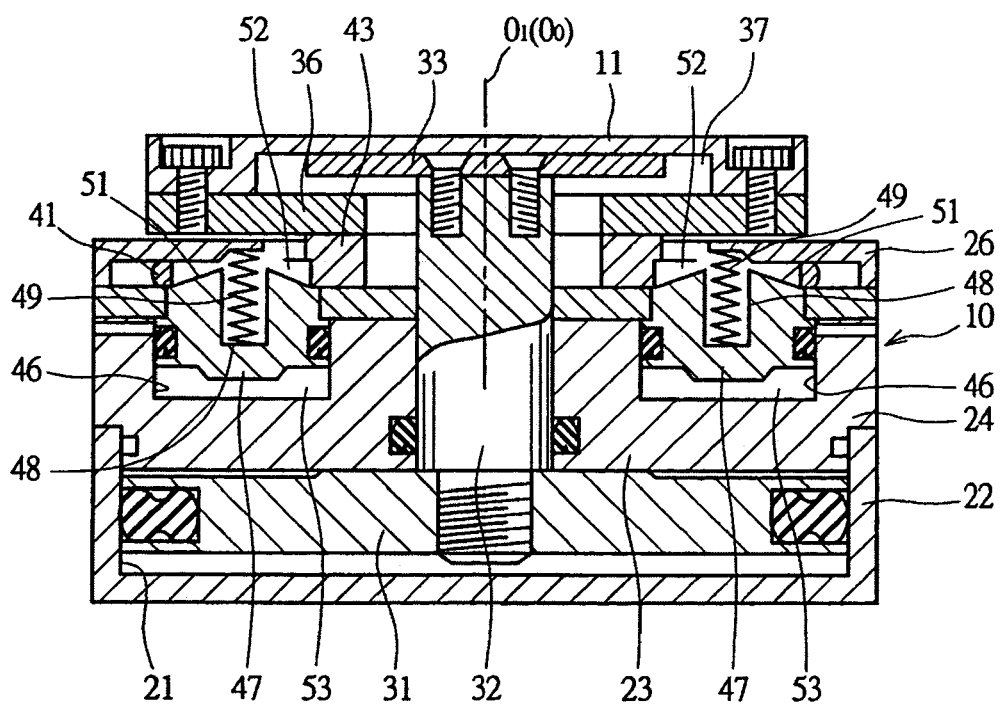
FIG. 7 is a cross-sectional view showing a state in which the floating plate is returned to an origin position.

FIG. 7 shows a state in which the compressed air is supplied into each of the air pressure chambers 53 from the supply/discharge port 54 under a state in which the lock plate 33 moves apart from the coupling plate 36 to release the fastening to the floating plate 41. Thus, when the compressed air is supplied into the air pressure chamber 53, the aligning piston 47 moves toward the floating plate 41 against the spring force of the compression coil spring 49. Accordingly, since the taper surface 51 formed in a tip of each of the aligning pistons 47 is brought into contact with an inner peripheral edge portion of the guide hole 56, the centers of two guide holes 56 coincide with the center of the aligning piston 47.

Accordingly, the floating plate 41 moves together with the tip plate 11 to a position where the center axis $O_1$ coincides with the center axis $O_0$ of the fastening rod 32. In other words, the floating plate 41 returns to the origin position coinciding with the reference axis. By doing so, in the case of using the workpiece holding device 15 while being positioned at the reference axis of the apparatus body 10, the floating plate 41 is fastened by the lock plate 33 in a state of coinciding with the reference axis.

In the illustrated handling apparatus, since such a structure is adopted that a lock at the position where the tip plate 11 is shifted by three pistons incorporated in the apparatus body 10 and a return to the origin position under a lock released state are carried out by three pneumatic pistons, it is possible to downsize the apparatus body.

Figure 8:
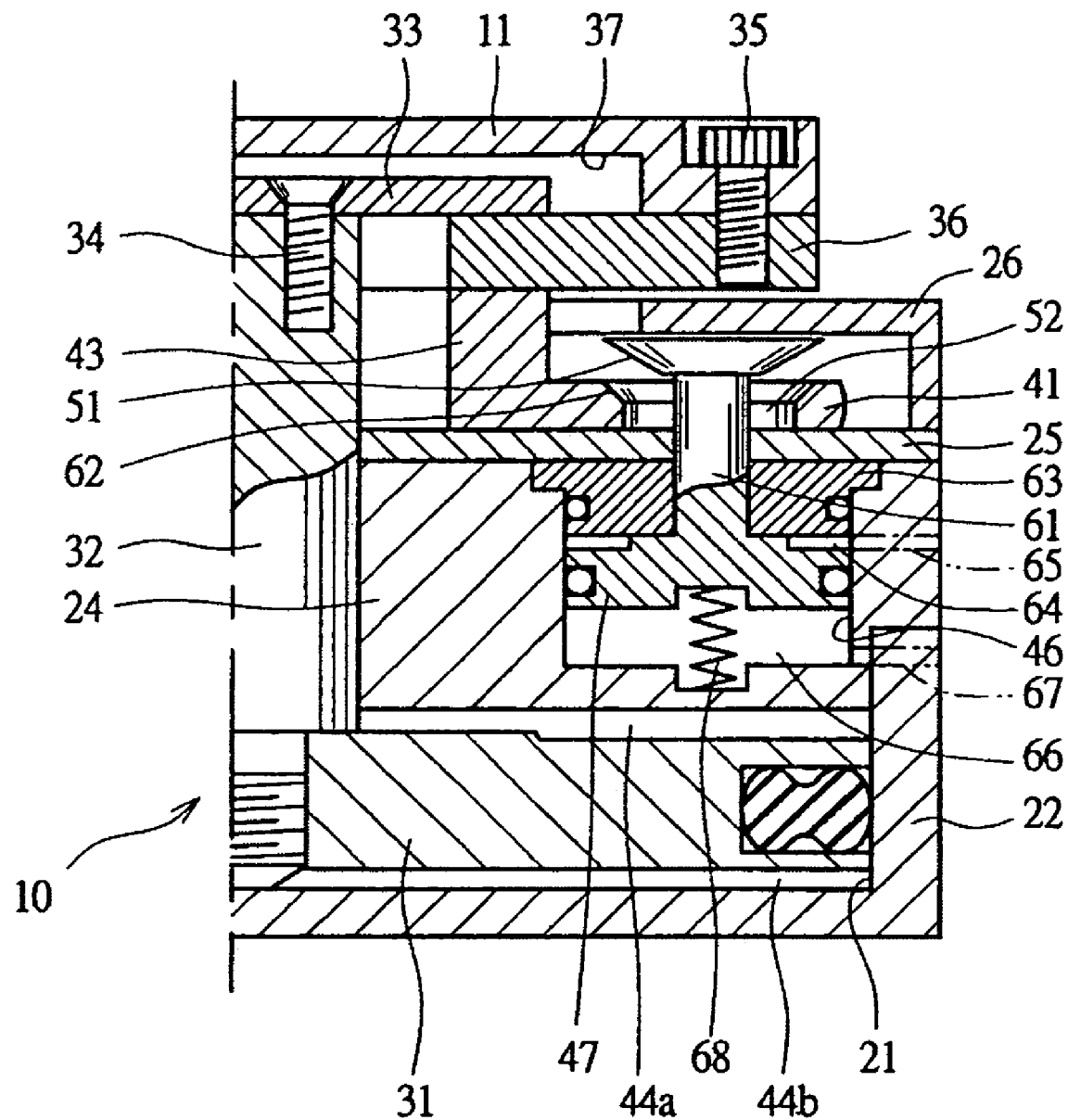
FIG. 8 is a cross-sectional view showing a portion of a handling apparatus according to another embodiment of the present invention.

FIG. 8 is a cross-sectional view showing a portion of a handling apparatus according to another embodiment of the present invention. In FIG. 8, members common to those constituting the handling apparatus as mentioned above are denoted by the same reference numerals.

In the handling apparatus, a piston rod 61 protruding into the cover 26 is provided in the aligning piston 47 accommodated within the piston-accommodating hole 46. The taper surface 51 to be engaged with the aligning hole 52 formed in the floating plate 41 is formed in a large-diameter head portion provided to a tip of the piston rod 61, and a taper surface 62 corresponding to the taper surface 51 is formed in an edge portion of the aligning hole 52. A rod cover 63 is attached to the piston-accommodating hole 46, and a supply/discharge port 65 communicates with an air pressure chamber 64 formed between the rod cover 63 and the aligning piston 47. Accordingly, when the compressed air is supplied to the air pressure chamber 64 from the supply/discharge port 65, a thrust in a pulling direction is applied to the aligning piston 47 and the taper surface 51 moves in a direction of pressing the floating plate 41, so that the taper surface 51 is engaged with the taper surface 62 of the aligning hole 52 and the floating plate 41 returns to the origin position.

A spring chamber 66 is formed on an opposite side to the air pressure chamber 64, and the spring chamber 66 communicates with the outside through a breathing hole 67. Further, a compression coil spring 68 is incorporated in the spring chamber 66 in order to apply a spring force in a direction in which the taper surface 51 moves apart from the floating plate 41 with respect to the aligning piston 47. When the compressed air within the air pressure chamber 64 is discharged, the taper surface 51 moves apart from the floating plate 41 due to the spring force.

The handling apparatus shown in FIG. 3 has a structure in which the floating plate 41 is returned to the origin position by supplying fluid pressure to the aligning piston 47 in a direction of coming close to the floating plate 41, that is, in a pressing direction. In contrast, the handling apparatus shown in FIG. 8 has a structure in which the floating plate 41 is returned to the origin position by supplying fluid pressure to the aligning piston 47 in a direction of moving apart from the floating plate 41, that is, in a pulling direction. In any type, a pressing force is applied to the floating plate 41 from the taper surface 51.

Figure 9:
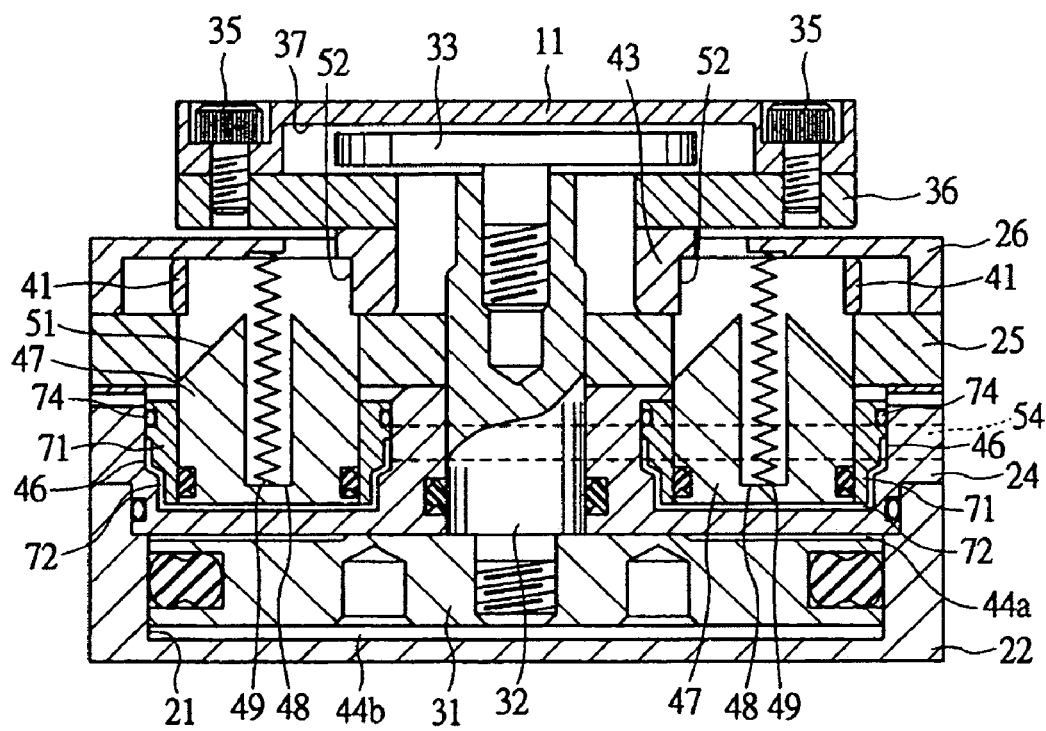
FIG. 9 is a cross-sectional view showing a handling apparatus according to still another embodiment of the present invention and shows a state in which an aligning piston is moved backward by a spring force.
Figure 10:
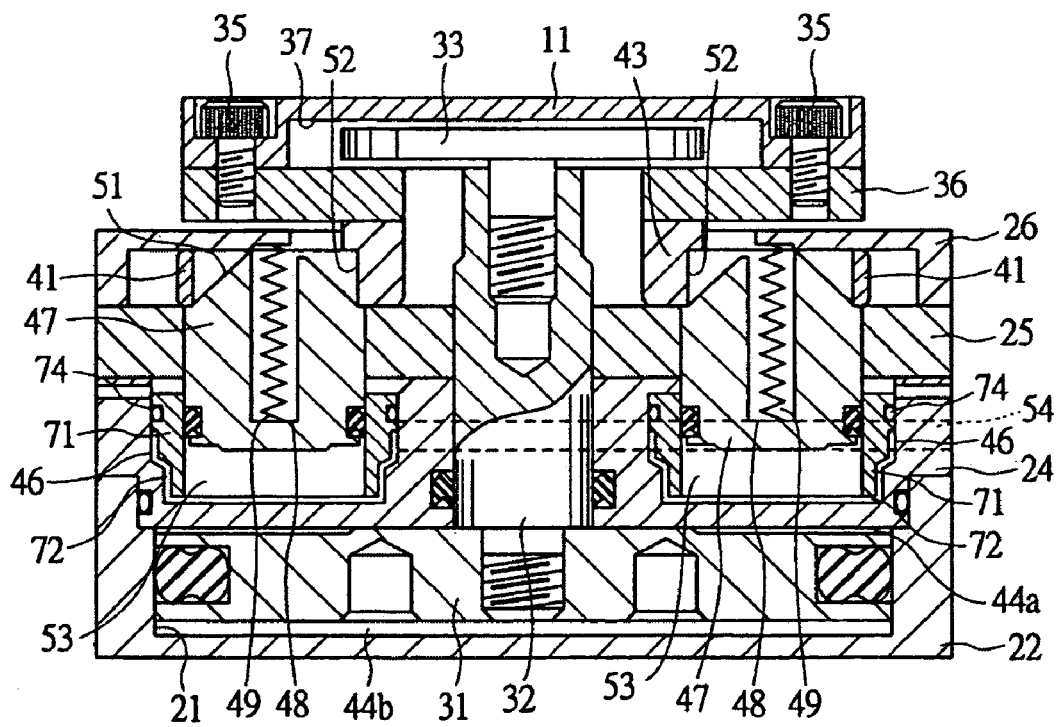
FIG. 10 is a cross-sectional view showing a state in which a floating plate shown in FIG. 9 is returned to an origin position by compressed air supplied to an air pressure chamber.

FIGS. 9 and 10 are cross-sectional views showing a handling apparatus according to still another embodiment of the present invention. In FIGS. 9 and 10, members common to those constituting the handling apparatus as mentioned above are denoted by the same reference numerals. This handling apparatus is such that a guide tube 71 is incorporated in the piston-accommodating hole 46 of the cylinder block 24 and the aligning piston 47 reciprocates along an inner peripheral surface of the guide tube 71. The air pressure chamber 53 formed in the guide tube 71 communicates with the supply/discharge port 54 shown by a dotted line via a gap 72 formed between the guide tube 71 and the piston-accommodating hole 46. In order to prevent air within the air pressure chamber 53 from leaking to a side of the positioning plate 25, a seal member 74 is incorporated in an outer periphery of the guide tube 71.

A tapered angle of the taper surface 51 formed at the aligning piston 47 is set to an acute angle smaller than that of the above-mentioned case. Accordingly, since a reciprocating stroke of the aligning piston 47 becomes longer than that of the above-mentioned case, thickness of the floating plate 41 is set thicker than that of the above-mentioned case. FIG. 9 shows a state in which the aligning piston 47 moves backward due to a spring force of the compression coil spring 49, and FIG. 10 shows a state in which the floating plate 41 is aligned by compression air supplied into the air pressure chamber 53.

The positioning plate 25 and the cover 26 shown in FIGS. 9 and 10 are made of porous materials, compressed air is supplied to an area surrounded by the positioning plate 25 and the cover 26 from an unshown air supply port, and the air is sprayed out toward slide surfaces between the floating plate 41 and the positioning plate 25 and between the floating plate 41 and the cover 26. Accordingly, air layers are formed between the surface of the floating plate 41 and the positioning plate 25 and between the surface of the floating plate 41 and the cover 26, whereby it is possible to improve a sliding characteristic of the floating plate 41. A surface exposing to the outside in the positioning plate 25 and the cover 26 is sealed to prevent the air from leaking to the outside. Also in the cases shown in FIGS. 9 and 10, the steel balls 57 and 58 may be interposed in the slide surface between the floating plate 41 and the cover 26 and in the slide surface between the floating plate 41 and the cylinder block 24, as shown in FIG. 5.

In the cases shown in FIGS. 9 and 10, the positioning plate 25 and the cover 26 are made of porous materials. However, such a structure may be adopted that the floating plate 41 is made of a porous material and the air layers are formed in both surfaces of the floating plate 41 by ejecting air from both surfaces of the floating plate, or that one of the positioning plate 25 and the cover 26 is made of a porous material and the air layer is formed on a side of one slide surface of the floating plate 41 corresponding thereto.

Thus, a structure in which at least one of the positioning plate 25, the cover 26 and the floating plate 41 is made of a porous material and the air layer is formed in any of the slide surfaces of the floating plate 41 can be applied to the above-mentioned embodiment in addition to those shown in FIGS. 9 and 10. Further, in the case of forming the positioning plate 25 or the like by using a porous material, such a structure may be adopted that a thin film of lubricating oil is formed on the slide surface by impregnating the lubricating oil in the porous material without circulating air via fine holes in the porous material.

The present invention is not limited to the above-mentioned embodiments and can be variously altered and modified within a scope of not departing from the gist thereof. For example, the number of provided aligning pistons 47 is two in the case shown in the drawings, but may be three or more. Further, the fastening piston 31 and two aligning pistons 47 are actuated by the compressed air, but may be actuated by another fluid such as hydraulic pressure. Further, the lock plate 33 is actuated by the compressed air, but may be driven by another driving means such as an electric motor.

INDUSTRIAL APPLICABILITY

The handling apparatus according to the present invention is used for conveying an electronic part serving as a workpiece while holding by the workpiece holding device such as a adsorption device or a chuck.

The invention claimed is:

1. A handling apparatus mounted on a moving member for holding, conveying and installing a workpiece comprising:
   an apparatus body attached to the moving member;
   a floating plate attached so as to be movable in a diametrical direction with respect to a center axis of the apparatus body, the floating plate to be mounted on a workpiece holding device for holding the workpiece;
   a fastening rod provided in the apparatus body so as to be reciprocable in an axial direction, a lock plate for fastening the floating plate is attached to the fastening rod; and
   a plurality of aligning pistons having taper surfaces engaged respectively with a plurality of aligning holes formed in the floating plate, the aligning pistons being mounted on the apparatus body so as to be reciprocable in the axial direction,
   wherein the floating plate is fastened to the apparatus body by the lock plate, and the floating plate is returned to a reference position of the apparatus body by the aligning pistons.

2. The handling apparatus according to claim 1, wherein a fastening piston is provided in the fastening rod, and a fastening force to the floating plate is applied by fluid.

3. The handling apparatus according to claim 1, wherein a pressing force in a direction of moving the taper surfaces toward the floating plate is generated by the fluid applied to the aligning pistons.

4. The handling apparatus according to claim 1, further comprising a regulating pin attached to the apparatus body so as to protrude into a guide hole formed in the floating plate and regulating a moving amount of the floating plate.

5. The handling apparatus according to claim 1, wherein a steel ball is interposed in a slide surface of the floating plate.

6. The handling apparatus according to claim 1, wherein an air layer is formed in a slide surface of the floating plate.

7. The handling apparatus according to claim 1, wherein a lubricating oil layer is formed in a slide surface of the floating plate.

* * * * *